US008515089B2

(12) United States Patent
Nicholson

(10) Patent No.: US 8,515,089 B2
(45) Date of Patent: *Aug. 20, 2013

(54) ACTIVE NOISE CANCELLATION DECISIONS IN A PORTABLE AUDIO DEVICE

(75) Inventor: Guy C. Nicholson, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 305 days.

This patent is subject to a terminal disclaimer.

(21) Appl. No.: 12/794,588

(22) Filed: Jun. 4, 2010

(65) Prior Publication Data

US 2011/0299695 A1 Dec. 8, 2011

(51) Int. Cl.
*H03B 29/00* (2006.01)

(52) U.S. Cl.
USPC .......................................................... 381/71.6

(58) Field of Classification Search
USPC .................... 381/71.6, 71.8, 71.11, 71.12, 74
See application file for complete search history.

(56) References Cited

U.S. PATENT DOCUMENTS

| | | | | |
|---|---|---|---|---|
| 4,811,404 | A | 3/1989 | Vilmur et al. | |
| 5,251,263 | A | 10/1993 | Andrea et al. | |
| 6,201,866 | B1 * | 3/2001 | Ariyama et al. | 379/406.01 |
| 6,278,786 | B1 * | 8/2001 | McIntosh | 381/71.6 |
| 7,035,796 | B1 * | 4/2006 | Zhang et al. | 704/226 |
| 7,203,308 | B2 | 4/2007 | Kubota | |
| 7,885,417 | B2 | 2/2011 | Christoph | |
| 2008/0162072 | A1 | 7/2008 | Copley et al. | |
| 2009/0034748 | A1 | 2/2009 | Sibbald | |
| 2009/0046867 | A1 | 2/2009 | Clemow | |
| 2009/0147969 | A1 | 6/2009 | Kinouchi et al. | |
| 2010/0022283 | A1 | 1/2010 | Terlizzi | |
| 2010/0260345 | A1 * | 10/2010 | Shridhar et al. | 381/71.1 |
| 2010/0296668 | A1 | 11/2010 | Lee et al. | |
| 2010/0322430 | A1 * | 12/2010 | Isberg | 381/71.6 |

FOREIGN PATENT DOCUMENTS

| | | | |
|---|---|---|---|
| DE | 4200811 | A1 | 7/1993 |
| GB | 2234881 | A | 2/1991 |
| GB | 2455827 | A | 6/2009 |
| JP | 2010019876 | | 1/2010 |
| WO | WO-2010022456 | A1 | 3/2010 |

OTHER PUBLICATIONS

"Series G: Transmission Systems and Media, Digital Systems and Networks", Voice enhancement devices, Amendment 1: Revised Appendix II—Objective measures for the characterization of the basic functioning of noise reduction algorithms, Nov. 2009, ITU-T Telecommunication Standardization Sector of ITU, G.160, (18 pages).

(Continued)

*Primary Examiner* — Ping Lee
(74) *Attorney, Agent, or Firm* — Blakely, Sokoloff, Taylor & Zafman LLP

(57) ABSTRACT

Active noise cancellation (ANC) circuitry is coupled to the input of an earpiece speaker in a portable audio device, to control the ambient acoustic noise outside of the device and that may be heard by a user of the device. A microphone is to pickup sound emitted from the earpiece speaker, as well as the ambient acoustic noise. Control circuitry deactivates the ANC in response to determining that an estimate of how much sound emitted from the earpiece speaker has been corrupted by noise indicates insufficient corruption by noise. In another embodiment, the ANC decision is in response to determining that an estimate of the ambient noise level is greater than a threshold level of an audio artifact that could be induced by the ANC. Other embodiments are also described and claimed.

12 Claims, 7 Drawing Sheets

(56) References Cited

OTHER PUBLICATIONS

PCT International Search Report and Written Opinion (dated Jun. 13, 2012), International Application No. PCT/US2011/038617, International Filing Date—May 31, 2011, (17 pages).

O'Shaughnessy, Douglas, "Speech Communications Human and Machine", Second Edition, The Institute of Electrical and Electronics Engineers, Inc., New York, USA, copyright 2000, ISBN 0-7803-3449-3, (pp. vii-xv, and 323-336).

PCT Invitation to Pay Additional Fees, (dated Feb. 24, 2012), International Application No. PCT/US2011/038617, International Filing Date—May 31, 2011, (7 pages).

PCT International Preliminary Report on Patentability and Written Opinion (dated Dec. 13, 2012), International Application No. PCT/US2011/038617, International Filing Date—May 31, 2011, (11 pages).

* cited by examiner

ACTIVE NOISE CANCELLATION DECISIONS IN A PORTABLE AUDIO DEVICE

An embodiment of the invention is related to activation and deactivation of an active noise cancellation (ANC) process or circuit in a portable audio device such as a mobile phone. Other embodiments are also described.

BACKGROUND

Mobile phones enable their users to conduct conversations in many different acoustic environments, some of which are relatively quiet while others are quite noisy. The user may be in a particularly hostile acoustic environment, that is, with high background or ambient noise levels, such as on a busy street or near an airport or train station. To improve intelligibility of the far-end user's speech to the near-end user who is in a hostile acoustic environment (i.e., an environment in which the ambient acoustic noise or unwanted sound surrounding the mobile phone is particularly high), an audio signal processing technique known as active noise cancellation (ANC) can be implemented in the mobile phone. With ANC, the background sound that is heard by the near-end user through the ear that is pressed against or that is carrying an earpiece speaker, is reduced by producing an anti-noise signal designed to cancel the background sound, and driving the earpiece speaker with this anti-noise signal. Such ambient noise reduction systems may be based on either one of two different principles, namely the "feedback" method, and the "feed-forward" method.

In the feedback method, a small microphone is placed inside a cavity that is formed between the user's ear and the inside of an earphone shell. This microphone is used to pickup the background sound that has leaked into that cavity. An output signal from the microphone is coupled back to the earpiece speaker via a negative feedback loop that may include analog amplifiers and digital filters. This forms a servo system in which the earpiece speaker is driven so as to attempt to create a null sound pressure level at the pickup microphone. In contrast, with the feed-forward method, the pickup microphone is placed on the exterior of the earpiece shell in order to directly detect the ambient noise. The detected signal is again amplified and may be inverted and otherwise filtered using analog and digital signal processing components, and then fed to the earpiece speaker. This is designed to create a combined acoustic output that contains not just the primary audio content signal (in this case the downlink speech of the far-end user) but also a noise reduction signal component. The latter is designed to essentially cancel the incoming ambient acoustic noise, at the outlet of the earpiece speaker. Both of these ANC techniques are intended to create an easy listening experience for the user of a portable audio device who is in a hostile acoustic noise environment.

SUMMARY

In one embodiment of the invention, a portable audio device has an earpiece speaker with an input to receive an audio signal, and a first microphone to pickup sound emitted from the earpiece signal, and any ambient or background acoustic noise that is outside of the device but that may be heard by a user of the device. The device also includes ANC circuitry that is coupled to the input of the earpiece speaker, to control the ambient acoustic noise. An estimate of how much sound emitted from the earpiece speaker has been corrupted by ambient acoustic noise is computed. Control circuitry then determines whether this estimate indicates insufficient corruption by noise, in which case it will deactivate the ANC circuitry. This will help preserve battery life in the portable device, since in many instances the acoustic environment surrounding the user of a portable audio device is not hostile, i.e. it is relatively quiet such that running ANC provides no user benefits.

If, however, the estimate indicates sufficient corruption by noise (e.g., when the user is in a hostile acoustic environment), then a decision is made to not deactivate the ANC circuitry. In other words, the ANC circuitry is allowed to continue to operate if the estimate indicates that there is sufficient corruption by ambient acoustic noise.

In one embodiment, estimates of the ambient acoustic noise and the primary audio signal are smoothed in accordance with subjective loudness weighting and then averaged, before computing a signal to noise ratio and then making the threshold decision as to whether to deactivate or activate the ANC. The subjective loudness weighting may be filtered so that only the frequencies where ANC is expected to be effective are taken into account (when determining the SNR). For example, in some cases, effective noise reduction by the ANC may be limited to the range 500-1500 Hz. Also, the decision whether to activate or deactivate the ANC may be taken only after having introduced hysteresis into the threshold SNR values, to prevent rapid switching of the decision near the threshold.

In another embodiment, a threshold representing an actual or expected strength of an audio artifact that could be induced by the ANC in sound emitted from the earpiece speaker is determined. This artifact is caused by operation of the ANC circuitry, and is some times referred to as a "hiss" that can be heard by the user. If the estimated ambient acoustic noise is deemed to be louder than the hiss threshold, then ANC is activated (or is not deactivated), thereby allowing the ANC to continue reducing unwanted ambient sound. On the other hand, if more hiss is being heard by the user than noise that needs to be canceled, then the ANC circuitry is deactivated. This reflects the situation where the ANC circuitry is not providing sufficient user benefit and thus may be shutdown to save power.

In accordance with another embodiment of the invention, a method for performing a call or playing an audio file or an audio stream using a portable audio device, may proceed as follows. ANC circuitry in the device is activated, to control ambient acoustic noise during the call or playback. An estimate of how much sound emitted from an earpiece speaker of the device has been corrupted by the ambient acoustic noise is computed. A determination is then made whether the estimate indicates insufficient corruption by noise, in which case the ANC circuitry is deactivated. On the other hand, if the estimate indicates sufficient corruption by noise, then the ANC circuitry is allowed to continue operation in an attempt to reduce the unwanted ambient sound. The estimate may be computed as signal to noise ratio (SNR), which may refer to a downlink speech signal or an audio signal produced when playing an audio file or an audio stream.

In one embodiment, the ANC circuitry may be deactivated by setting the tap coefficients of a digital anti-noise filter (whose output feeds the earpiece speaker) to zero, so that essentially no signal is output by the filter. In addition, the deactivation of the ANC circuitry may also include at the same time disabling an adaptive filter controller that normally updates those tap coefficients, so that the tap coefficients are no longer being updated.

In an alternative embodiment, the ANC circuitry may be deactivated by disabling the adaptive filter controller so that the tap coefficients of the anti-noise filter are no longer being updated (e.g., freezing the adaptive filter, so that although some signal is output by the anti-noise filter, the latter is not changing and the controller is not computing any updates to it).

In yet another embodiment of the method for performing a call or playing an audio file or audio stream using the portable audio device, the ANC circuitry is not activated during the call or playback, until a determination has been made that there is sufficient corruption, due to the presence of ambient acoustic noise, of the sound being emitted from the earpiece speaker. Thereafter, an estimate of how much sound emitted from the earpiece speaker (during the call or playback) is being corrupted is again computed, and if there is insufficient corruption by the ambient acoustic noise then the ANC circuitry is deactivated.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
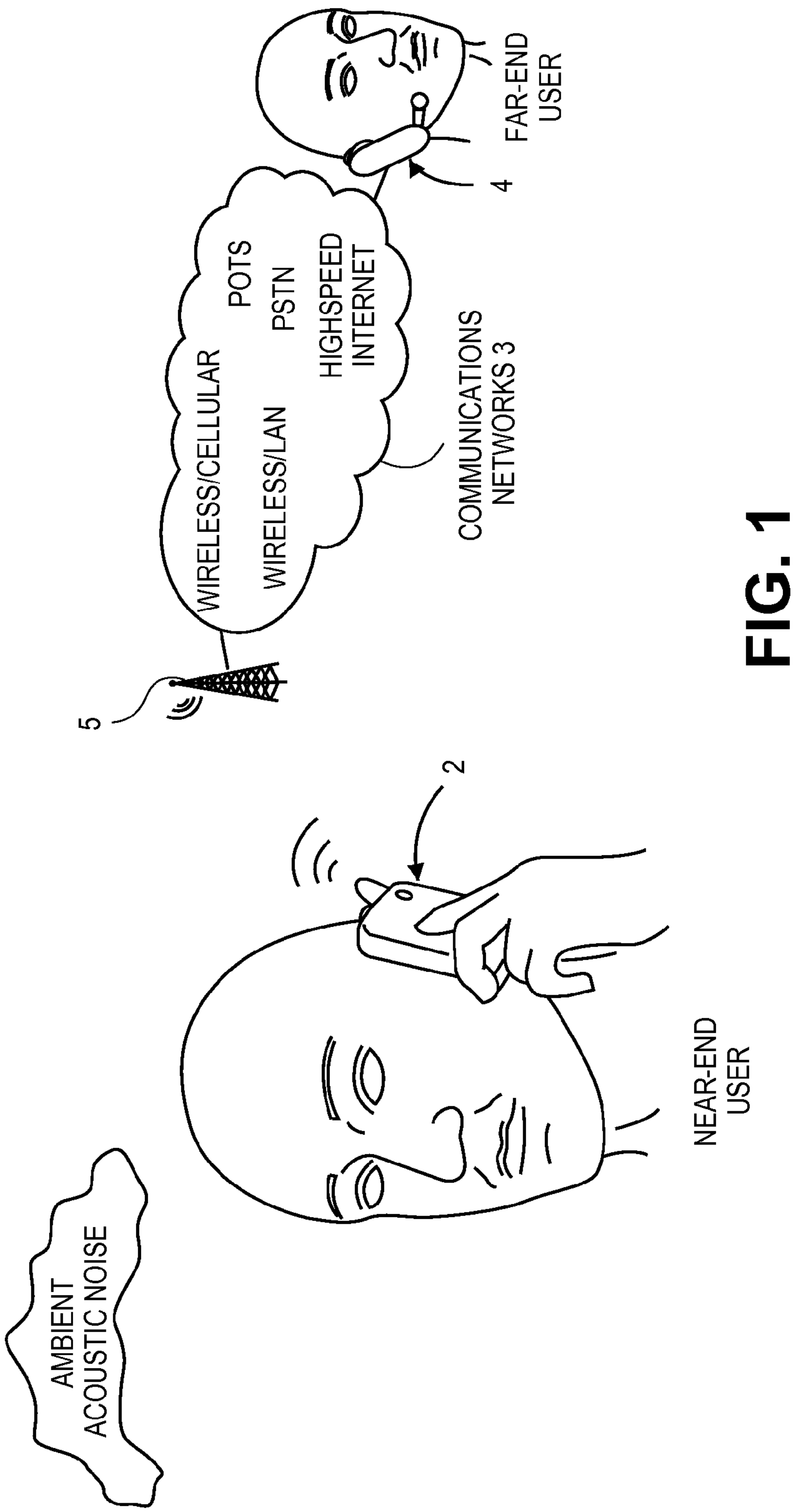
FIG. 1 depicts a mobile communications device in use by a user in a hostile acoustic environment.

FIG. 1 depicts a portable audio device 2, here a mobile communications device, in use by a near-end user in a hostile acoustic environment. The near-end user is holding the portable audio device 2, and in particular, an earpiece speaker 6, against his ear, while conducting a conversation with a far-end user. The conversation occurs generally in what is referred to as a "call" between the near-end user's portable audio device 2 and the far-end user's audio device 4. The call or communications connection or channel, in this case, includes a wireless segment in which a base station 5 communicates using, for instance, a cellular telephone protocol, with the near-end user's device 2. In general, however, the ANC decision making mechanisms described here are applicable to other types of handheld, battery-powered audio devices including portable audio communication devices that use any known types of networks 3 including wireless/cellular and wireless/local area network, in conjunction with plain old telephone system (POTS), public switched telephone network (PSTN), and perhaps one or more segments over high speed Internet connections (e.g., using voice over Internet protocol).

During the call, the near-end user would hear some of the ambient acoustic noise that surrounds him, where the ambient acoustic noise may leak into the cavity that has been created between the user's ear and the shell or housing behind which the earpiece speaker 6 is located. In this monaural arrangement, the near-end user can hear the speech of the far-end user in his left ear, but in addition may also hear some of the ambient acoustic noise that has leaked into the cavity next to his left ear. The near-end user's right ear is completely exposed to the ambient noise.

As explained above, an active noise cancellation (ANC) mechanism operating within the audio device 2 can reduce the unwanted sound that travels into the left ear of the user and that would otherwise corrupt the primary audio content which in this case is the speech of the far-end user. In some cases, however, ANC imparts little apparent improvement on speech intelligibility, particularly where the signal-to-noise ratio (SNR) at the user's ear is greater than a certain threshold (as discussed below). Moreover, ANC induces audible artifacts that can be heard by the user in relatively quiet environments. The various embodiments of the invention make decisions on activation and deactivation of ANC in a way that helps reduce the presence of such audible artifacts and conserves power, when it has been determined that the ANC would not be of substantial benefit to the user.

Figure 2:
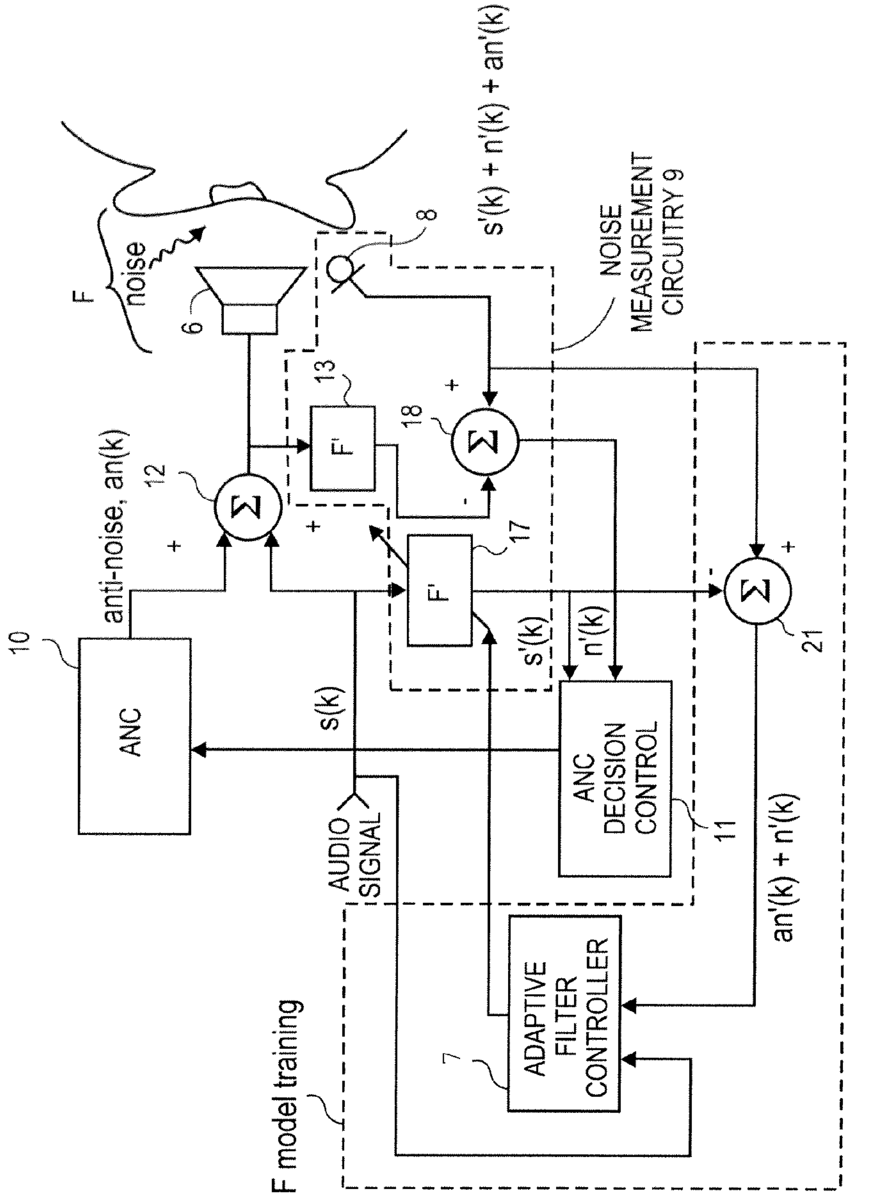
FIG. 2 is a block diagram of system for making ANC decisions in an audio device based on estimates of signal and noise.

Turning now to FIG. 2, a block diagram of a system for making ANC decisions in an audio device based on estimates of signal and noise is shown. An ANC block 10 (also referred to as ANC circuitry 10) generates an anti-noise signal, an(k), that is combined with the desired audio signal by a mixer 12, before being fed to the input of the earpiece speaker 6. This may be an entirely conventional feedback or feed forward ANC mechanism. In accordance with an embodiment of the invention, an ANC decision control block 11 determines whether to activate or deactivate the ANC block 10, based on computed or estimated values for signal, s'(k), and noise, n'(k). The references to s'(k) and n'(k) are used here to represent a time sequence of discrete values, as the signal processing operations performed on any audio signals by the blocks depicted in this disclosure are in the discrete time domain. More generally, it is possible to implement some or all of the functional unit blocks in analog form (continuous time domain). However, it is believed that the digital domain is more flexible and more suitable for implementation in modern, consumer electronic audio devices, such as smart phones, digital media players, and desktop and notebook personal computers.

The signal and noise estimates are computed by noise measurement circuitry 9, which includes an error microphone 8 that is located and oriented in such a manner as to pickup both (a) sound emitted from the earpiece speaker 6 and (b) the ambient acoustic noise that has leaked into the cavity or region between the handset housing or shell (not shown) that is in front of the earpiece speaker 6 and the user's ear. The error microphone 8 may be embedded in the housing of a cellular handset in which the earpiece speaker 6 is also integrated, directed at the cavity formed by the user's ear and the front face earpiece region of the handset, i.e. located close to the earpiece speaker and far from the primary or talker microphone (not shown) that is used to pickup the near-end user's speech. This combination of the earpiece speaker 6 and the error microphone 8, along with the acoustic cavity formed against the user's ear, is referred to as the system or plant that is being controlled by the ANC circuitry 10; the frequency response of this system or plant is labeled F. A digital filter models the system or plant F, and is described as having a frequency response F', an instance of which appears in the noise measurement circuitry 9 as first filter 13 as shown. A signal picked up by the microphone is fed to a differencing unit 18 whose other input receives a signal from the output of the first filter 13. This allows the output of the differencing unit 18 to provide an estimate of the ambient acoustic noise, n'(k), while the output of a second filter 17 (being a second instance of F') provides an estimate of the primary or desired audio signal, s'(k) (here, the downlink speech signal).

The estimated signals s'(k) and n'(k) are input to the ANC decision control circuitry 11, which can then determine an estimate of how much sound emitted from the earpiece speaker 6 has been corrupted by the ambient acoustic noise (e.g., SNR). The SNR may be calculated in the primarily audible frequency range in which ANC is effective, e.g. at the low end between 300-500 Hz, up to at the high end 1.5-2 kHz. The signal and noise levels may be computed as signal energy within the ANC's effective frequency range and in a finite time interval or frame of the sequences s'(k) and n'(k). If the indication is that there is insufficient corruption by noise (or the SNR is greater than a predetermined threshold), then the ANC circuitry 10 is deactivated, consistent with the belief that ANC in this situation may not be of benefit to the near-end user.

The ANC decision control 11 may alternatively determine that its computed estimate does indicate sufficient corruption by noise (or the SNR is smaller than the predetermined threshold). In that case, the ANC circuitry 10 should not be deactivated (consistent with the belief here that the ANC is expected to benefit the near-end user by increasing intelligibility of the far-end user's speech). In a further embodiment of the invention, the ANC decision control 11 then actually activates the ANC circuitry 10.

Still referring to FIG. 2, in the embodiment where the earpiece speaker 6 is an integrated "receiver" of a mobile or wireless telephony handset (e.g., a cellular phone, a smart phone with wireless local area network-based Internet telephony capability, and a satellite-based mobile phone), the plant F varies substantially e.g., by as much as 40 decibels, depending on how and whether or not the user is holding the handset earpiece region against their ear. In that case, a fixed model for the transfer function F' (which appears in both filters 13, 17) may not work to properly determine the signal and noise estimates s'(k) and n'(k). Accordingly, the transfer function F' should be updated continuously during operation of the handset (e.g., during a call). The filters 13, 17 may be implemented as digital adaptive filters whose tap coefficients are adapted by an adaptive filter controller 7 according to any suitable conventional algorithm, e.g. least mean squares algorithm. The adaptive filter controller 7 takes as input the audio signal (which is also input to a mixer 12) and the estimate for noise, n'(k), and using, for example, the least mean squares algorithm, conducts an iterative process that attempts to converge the tap coefficients so that very little or no content from the audio signal appears in the output of a differencing unit 21. In other words, the adaptive filter controller 7 adapts the tap coefficients (reflected in both filters 13, 17) so that its transfer function F' will in essence match that of the system or plant F. In practice, there may be a short convergence time needed to obtain such a match (e.g., on the order of one or two seconds, for example), as the plant F changes when the user moves the handset on and off their ear. Therefore, any decision by the ANC decision control block 11 may be conditioned upon a signal from the adaptive filter controller 7 that the modeling of the plant F is up to date or that there is sufficient convergence in the adaptive filter algorithm.

The arrangement depicted in FIG. 2 may be implemented in practice within an audio coder/decoder integrated circuit die (also referred to as a codec chip) that may perform several other audio related functions such as analog-to-digital conversion, digital-to-analog conversion, and analog pre-amplification of microphone signals. In other embodiments, the arrangement of FIG. 2 may be implemented in a digital signal processing codec suitable for mobile wireless communications, where the codec may include functions such as downlink and uplink speech enhancement processing, e.g. one or more of the following: mixing, acoustic echo cancellation, noise suppression, speech channel automatic gain control, companding and expansion, and equalization. The entire functionality depicted in FIG. 2 may be performed in discrete-time domain, in which analog signals such as the output of an analog microphone have been converted to digital form, and the output signal of the mixer 12 has been converted to analog form prior to being input to the earpiece speaker 6; these well known aspects need not be explicitly described or shown indicated in the figures.

Figure 3:
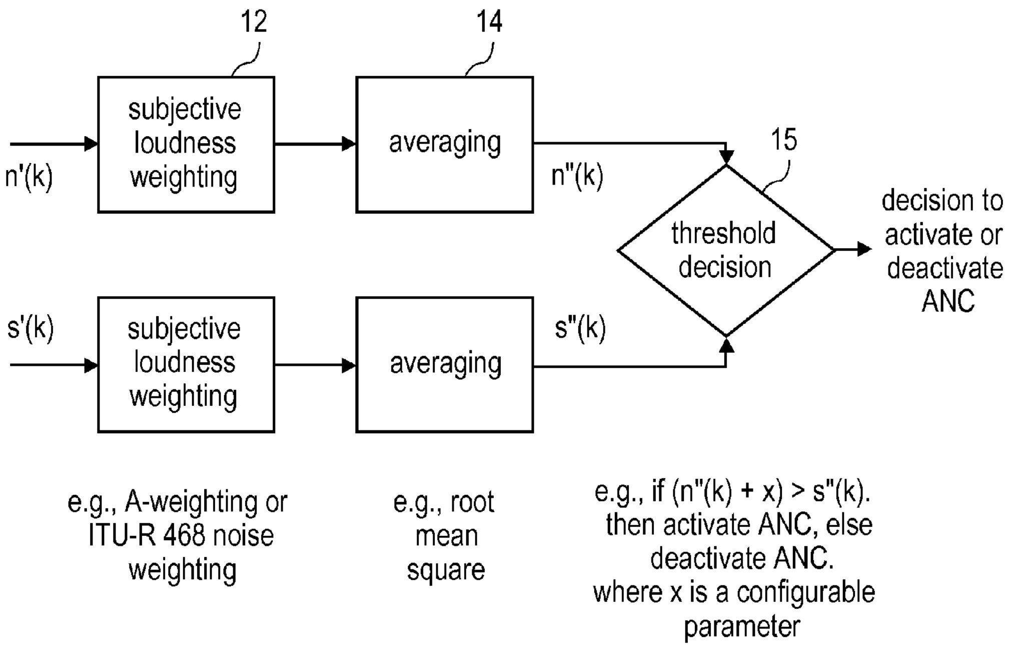
FIG. 3 is a block diagram of an algorithm for the control process or circuitry that makes the decision whether to activate or deactivate ANC, based on signal and noise estimates.

Turning now to FIG. 3, an algorithm for the ANC decision control 11 (see FIG. 2) is shown, where signal to noise ratio (SNR) is computed and compared to a threshold. The blocks depicted in FIG. 3 may be digital time-domain processing elements, or they may be frequency domain processing elements. Both the signal and noise estimates, s'(k) and n'(k), pass through a smoothing conditioner, which in this case includes a subjective loudness weighting block 12 and an averaging block 14. The loudness weighting block 12 may be a typical filtering operation used when measuring noise in audio systems (e.g., A-weighting, ITU-R 468). The averaging block 14 may implement a typical root mean square or other suitable signal averaging algorithm, e.g. ITU-T G.160, exemplified by the following formula $$y_r(k) = \frac{1}{n}\sum_{i=k-n+1}^{k} x_i^2$$

The output sequences following the loudness weighting and averaging blocks 12, 14 are then used by the threshold decision block 15 to compute the signal to noise ratio by essentially comparing the smoothed noise estimate n''(k) to the smoothed signal estimate s''(k) based on a configurable threshold parameter x as shown in FIG. 3. This block essentially determines whether the sound being emitted from the earpiece speaker 6 has been sufficiently corrupted by the ambient acoustic noise (see FIG. 2) as follows. If the SNR is below a configurable parameter or threshold, then the decision is made to not deactivate the ANC circuitry, or to activate it. That is because in this case, it is expected that ANC is likely to achieve some substantial reduction in the unwanted sound that the user may be hearing. On the other hand, if the SNR is above the threshold, then this suggests that the ambient acoustic environment may be sufficiently quiet such that ANC is likely to provide no benefit to the user and hence should be deactivated or disabled, or not activated or enabled, to save power and avoid unwanted audio artifacts.

Figure 4:
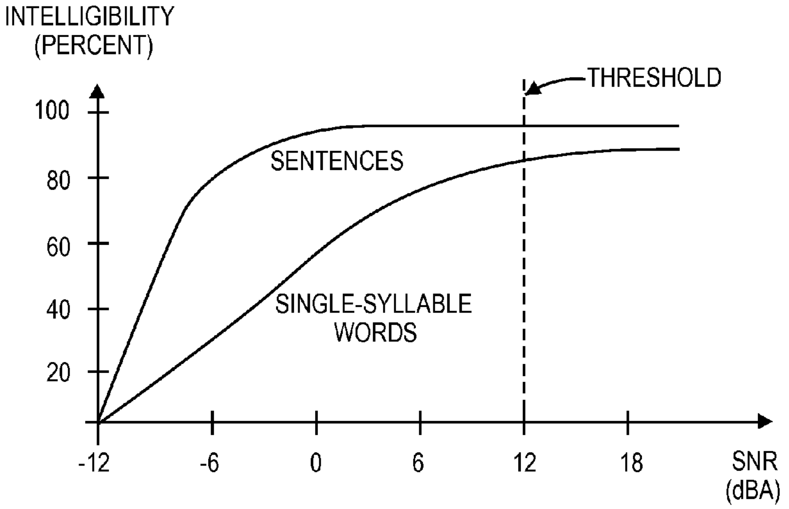
FIG. 4 is a plot of intelligibility versus SNR for sentences and single-syllable words.

The threshold for the SNR comparison may be determined using known information that has been published about the intelligibility of various types of speech being carried by typical communications systems. FIG. 4 depicts the results of such findings. In accordance with an embodiment of the invention, a particular threshold that may be suitable for the ANC decision control 11 is approximately 12 dBA. At 12 dBA, it is expected that single-syllable words are intelligible 80% of the time or more, whereas sentences are intelligible more than 90% of the time. More generally, however, the threshold may be set above 12 dBA or below 12 dBA, with the understanding that by setting the threshold higher, the ambient acoustic noise level needs to be even lower in order to make the decision to deactivate the ANC.

Figure 5:
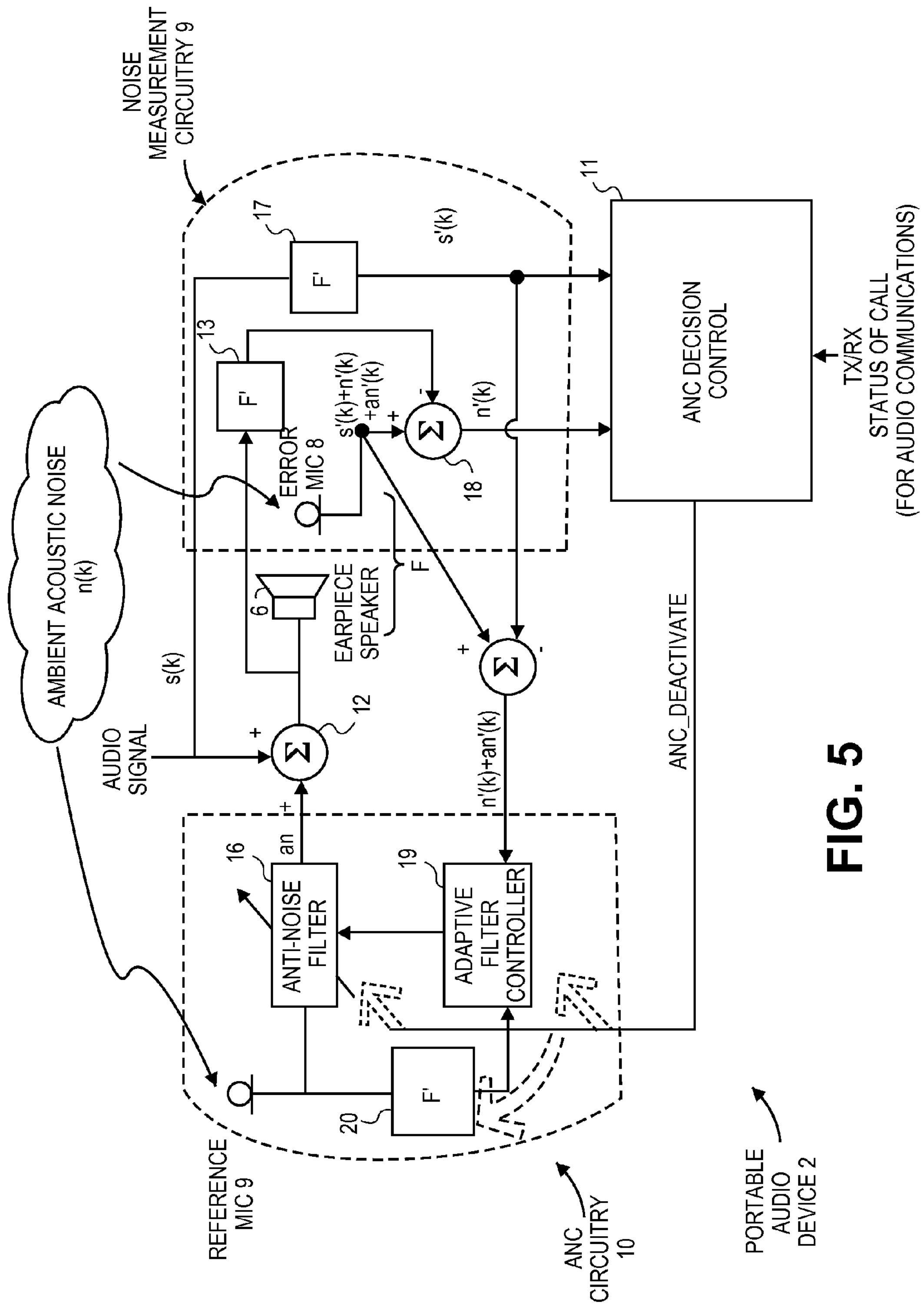
FIG. 5 is a block diagram of feed forward ANC and ANC decision control based on signal and noise estimates.

Turning now to FIG. 5, a block diagram of feed forward ANC is shown, together with the same noise measurement circuitry 9 and ANC decision control 11 of FIG. 2. In this embodiment of the invention, the ANC circuitry 10 includes a reference microphone 9 that in one embodiment may also be integrated in the handset housing of the portable audio device 2, and is located and oriented so as to pickup the ambient acoustic noise. In other words, the reference microphone 9 is oriented and thus intended to primarily detect the ambient acoustic noise, rather than speech of the near-end user or any sounds being emitted from the earpiece speaker 6. In some cases, the reference microphone 9 will be located farther away from the earpiece speaker 6 than the error microphone 8, or it may be oriented in a different direction than the primary or talker microphone (not shown), which is typically used to pickup the speech of the near-end user. For instance, referring now to FIG. 1, the reference microphone 9 may be directed out of the back face of the handset housing of the portable audio device, in contrast to the earpiece speaker 6, which is directed out of the front face or a bottom side.

The feed forward arrangement of FIG. 5 would also include an anti-noise filter 16 whose input may be coupled to the output of the reference microphone 9, while its output produces the anti-noise signal that feeds the mixer 12. In addition, in this embodiment of the invention, the ANC circuitry 10 includes an adaptive filter controller 19, which continuously adjusts the tap coefficients of the anti-noise filter 16 in order to achieve the lowest level of total noise in the earpiece cavity. To do so, the adaptive filter controller 19 receives as input a filtered version of the output of the reference microphone 9, using a filter 20 whose transfer function is also F' which is a model of the actual system or plant F. This is in effect another estimate of the ambient acoustic noise that may be heard by the user. The adaptive filter controller 19, based on these two noise estimates as input, adjusts the anti-noise filter 16 continuously, so as to reduce or minimize the amount of noise in the earpiece cavity (that is, sound picked up by the error microphone 8 with the filtered speech signal, s'(k) subtracted). In one embodiment, a least means square algorithm may also be used for the adaptive filter controller 19 in order to converge on a solution for the tap coefficients of the anti-noise filter 16 that minimizes the estimated noise in the earpiece cavity, n'(k)+an'(k).

It should be noted that although not explicitly depicted in FIG. 5, the modeling of the plant F by the transfer function F' that appears in filters 13, 17, 20 should be "online", that is continuously adjusted during operation of the portable audio device 2. Thus, the transfer function F' is not fixed, but rather varies in order to match the changes that occur in the actual plant F due to the user moving the handset earpiece region on and off their ear.

Figure 6:
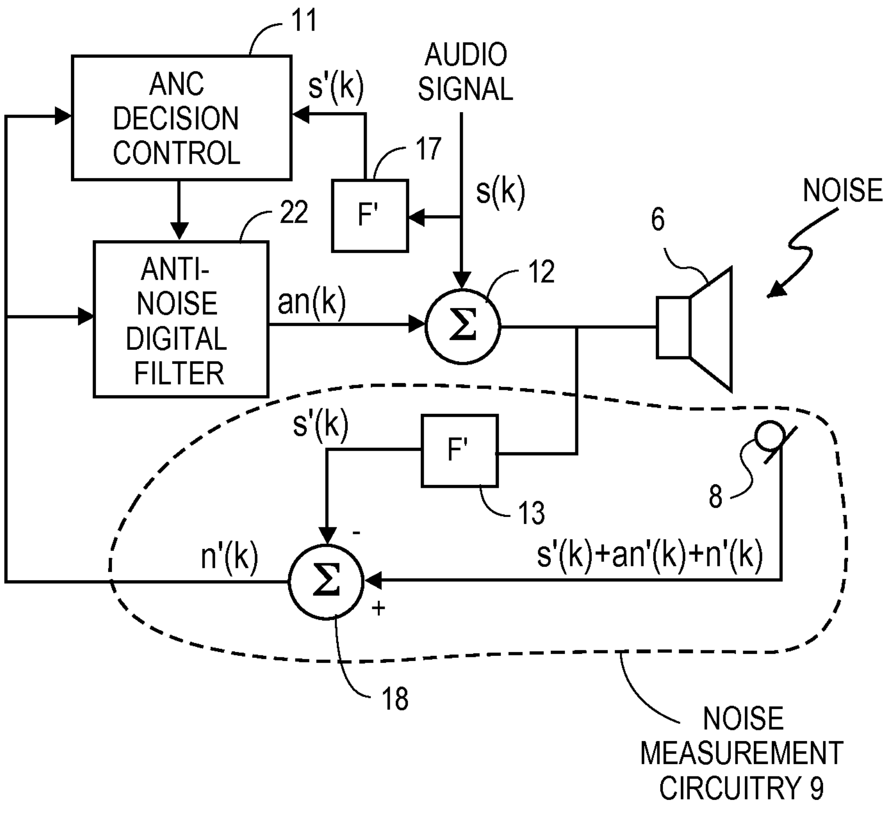
FIG. 6 is a block diagram of feedback ANC and ANC decision control based on signal and noise estimates.

In contrast to the feed forward mechanism for ANC depicted in FIG. 5, FIG. 6 shows a block diagram of feedback ANC. In this case, the noise measurement circuitry 9 and the mixer 12 are arranged in the same manner as in FIG. 5, except that now the anti-noise signal input to the mixer 12 is generated by an anti-noise digital filter 22 whose input is coupled to receive the noise estimate, n'(k). The ANC decision control 11 may operate in the same manner as in FIG. 5, having as inputs the noise and signal estimates and using them to determine how much sound emitted from the earpiece speaker 6 has been corrupted by the ambient acoustic noise (and on that basis deactivates or activates the anti-noise digital filter 22). In one embodiment, the anti-noise digital filter 22 performs a simple inversion of its input sequence, so as to cancel the unwanted sound (ambient acoustic noise) at the output of the earpiece speaker 6, by generating an inverse of the estimate n'(k).

Until now, this disclosure has been referring to the activation and deactivation of the ANC circuitry 10, or the anti-noise filter 22 (FIG. 6), in a general sense. There may be several different implementations to achieve such activation and deactivation. In one embodiment, the ANC may be deactivated by setting the tap coefficients of the anti-noise filter 16 (see FIG. 5) and the anti-noise filter 22 (FIG. 6), to zero, so that no signal is output by these filters. This is essentially similar to opening a hard switch that may be inserted between the output of the filter 16, 22 and the input to the mixer 12. This deactivation of the filter 16, 22 may be accompanied by simultaneous disabling of the adaptive filter controller 19 (in the feed forward embodiment depicted in FIG. 5), so that the tap coefficients of the anti-noise filter 16 are no longer being updated. As an example, in the case of an LMS controller, this could be achieved by setting the LMS gain to zero, thereby forcing the controller to stop updating.

In another embodiment, the ANC may be deactivated by only disabling the adaptive filter controller 19 (FIG. 5), so that the tap coefficients of the anti-noise filter 16 are no longer being updated. In that case, some anti-noise signal is output by the anti-noise filter 16, however, the filter transfer function is not changing and the controller 19 is not computing any updates to the filter 16. This may also be referred to as freezing the adaptive filter controller 19.

Similarly, activation of the ANC would involve the reverse of the operations described above, e.g. unfreezing the adaptive filter controller 19 and allowing the tap coefficients of the anti-noise filter 16 to be set by the controller 19, or to revert back to a predetermined default (e.g., in the case of the anti-noise filter 22 used in the feedback version depicted in FIG. 6).

Figure 7:
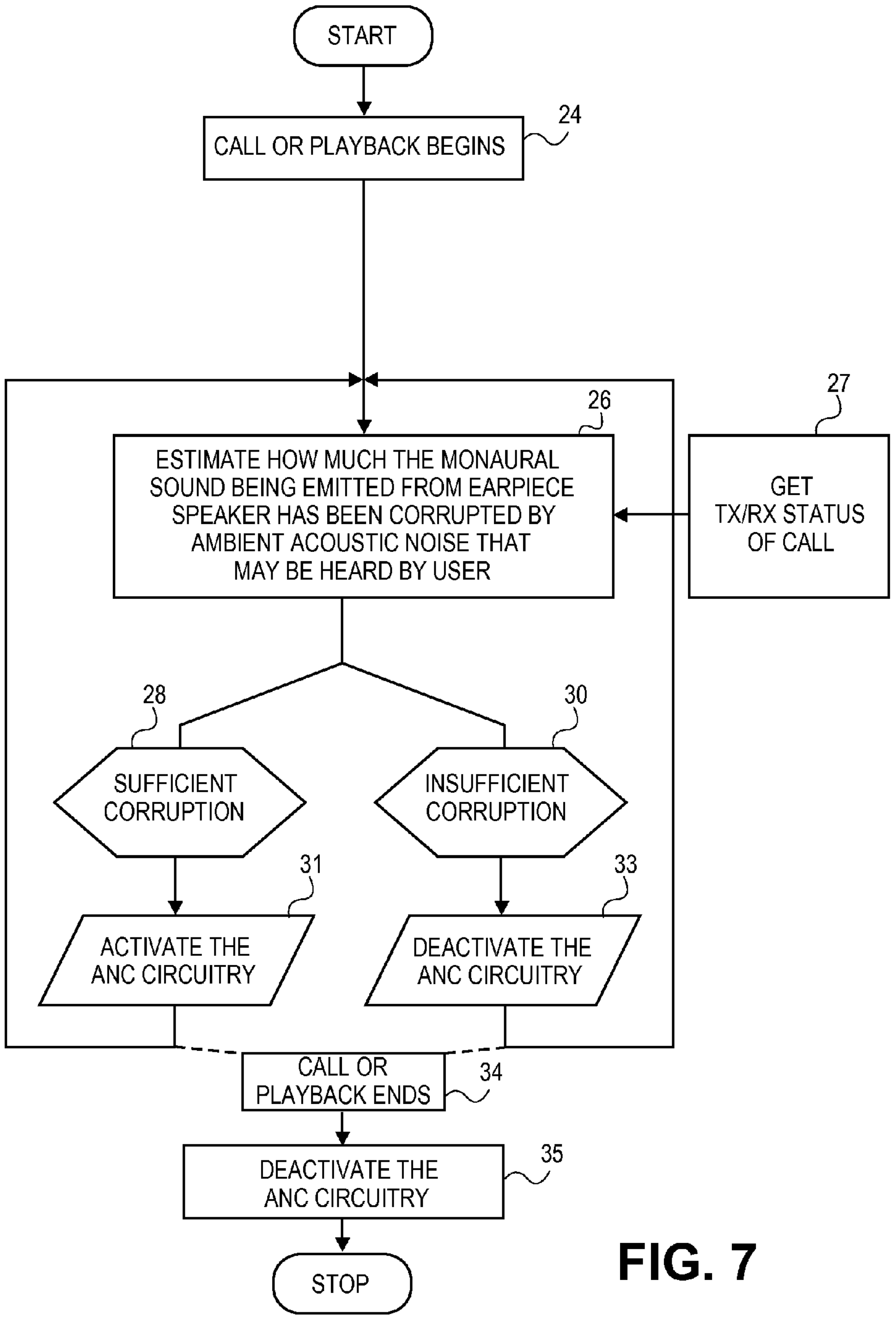
FIG. 7 depicts an algorithm or process for ANC decision making.

Turning now to FIG. 7, an algorithm or process flow for ANC decision making is depicted. Operation begins in a portable audio communications device when a call or playback of an audio file or audio stream begins (block 24). At this point, the ANC circuitry may or may not be activated. Operation continues with block 26 in which an estimate of how much the monaural sound being emitted from the earpiece speaker has been corrupted by ambient acoustic noise (that may be heard by the user) is computed. This is also referred to as computing the SNR.

In some cases, the speech of the near-end user may cause a relatively low SNR to be computed in block 26 possibly due to a side tone signal which may also be input to the mixer 12—see FIG. 2. Therefore, in one embodiment, block 26 is performed only if the portable audio communications device 2 is in RX status, that is, no uplink speech is being transmitted. In other words, the decision to deactivate ANC should only be made when the near-end user is not talking (but the far-end user may be talking). This may require obtaining transmit or receive (TX/RX) status of the call, in block 27.

Assuming that the portable audio device is not sending uplink speech (or is in RX status as determined in block 27), then a decision may be made regarding whether there is sufficient corruption (block 28) or there is insufficient corruption (block 30) of the downlink speech signal (by the ambient noise). If there is sufficient corruption (block 28), then the ANC circuitry is activated (block 31). This leads to a reduction in the ambient noise that is being heard by the user, due to an anti-noise signal being driven through the earpiece speaker. The algorithm may then loop back to block 26 after some predetermined time interval, e.g., the next audio frame in s'(k) and n'(k), until the call or playback ends (block 34). At that point, the ANC circuitry can be deactivated (block 35).

In another scenario, after the initial activation of the ANC circuitry in block 31, during the call, the algorithm loops back to block 26 and computes a new estimate of the SNR, during the call. This time, it may be that the ambient acoustic noise level has dropped sufficiently such that there is insufficient corruption of the downlink speech signal (block 30). In response, the ANC circuitry is deactivated (block 33). Accordingly, during a call, the ANC circuitry may be activated and then deactivated several times, depending upon the level of ambient acoustic noise, and how much the downlink speech signal is corrupted as a result.

In another embodiment, still referring to the algorithm of FIG. 7, once the call or playback begins (block 24), the ANC circuitry may be automatically activated to control the ambient noise being heard by the user during the call. The algorithm would then proceed once again with block 26 where it estimates how much the downlink speech is corrupted by the ambient noise, and if there is insufficient corruption (block 30), then the ANC circuitry is deactivated during the call. Thereafter, the algorithm loops back to block 26 to re-compute the signal-to-noise ratio and this time if it encounters sufficient corruption by noise, the ANC circuitry may be reactivated (block 31) during the call.

Until now, the ANC activation/deactivation decisions have been based on estimates of signal and noise. In accordance with another embodiment of the invention, the ANC decision control 11 is based on the actual or expected presence of an audio artifact induced by operation of the ANC. This is also referred to as the "hiss threshold" embodiment. This embodiment may use the same noise measurement circuitry 9 and the ANC circuitry 10 of the feed forward or feedback embodiments, except that the ANC decision control block 11 makes a comparison between the estimated ambient acoustic noise and a hiss threshold to determine if the ambient acoustic noise is louder than any hiss that might be heard by the user. If not, then the ANC should be deactivated.

In one embodiment, the ANC decision control 11 computes the strength of an audio artifact that has been caused or induced by operation of the ANC circuitry 10, and that may be heard by the user in the sound emitted from the earpiece speaker 6. This artifact is some times referred to as a hiss. A threshold level or loudness is used to represent the strength of the audio artifact, and this threshold level may be stored in the device 2 to be accessed by the ANC decision control 11 when comparing to the estimated ambient noise n'(k).

In another embodiment, the ANC decision control 11 determines whether the audio artifact's strength is greater than the estimated level of the ambient acoustic noise n'(k). If the audio artifact is louder than the ambient noise, then the ANC circuitry 10 is deactivated.

In one embodiment, the artifact is present above the frequency range in which the ANC is expected to be effective. For instance, the ANC may be effective to reduce noise at the low end between 300-500 Hz, up to a high end of 1.5-2 kHz. The hiss in that case would likely appear above 2 kHz. Thus, if the signal energy above 2 kHz is greater than the noise energy in the range that the ANC is believed to be effective, than the user is likely hearing more hiss than ambient noise.

Figure 8:
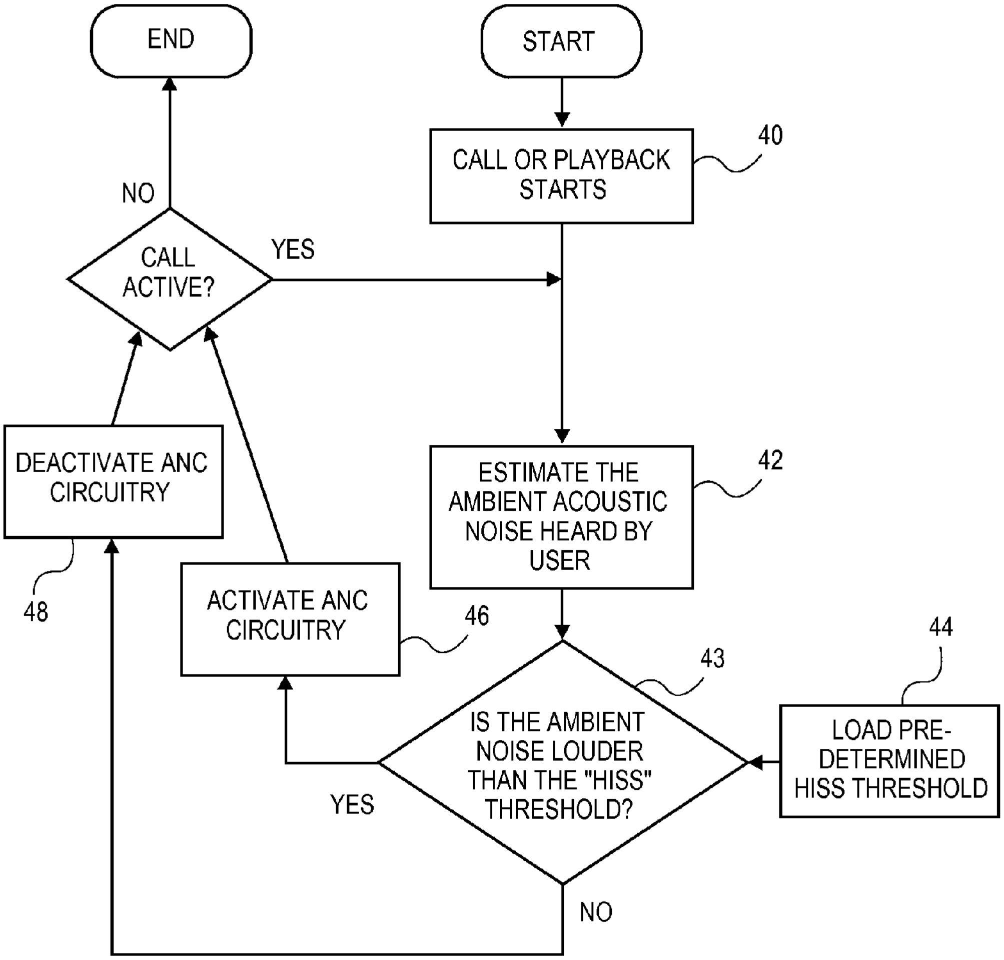
FIG. 8 depicts another algorithm for ANC decision making, based on computing the strength of ambient noise and comparing it to a hiss threshold.

An algorithm for ANC decision making based on a comparison of the ambient noise to an expected or actual audio artifact is depicted in FIG. 8. Once a call or playback of an audio file or stream begins (block 40), the ANC circuitry may or may not be automatically activated. At that point, the ambient acoustic noise heard by the user is estimated (block 42). If the estimated ambient noise is "louder" than a hiss threshold (which may a predetermined threshold that is loaded from memory—block 44), then the ANC circuitry is in response activated (block 46). On the other hand, if the ambient noise is not loud enough, then the ANC circuitry remains deactivated or is deactivated (block 48).

It should be noted that while the algorithms in FIG. 7 (based on SNR) and in FIG. 8 (based on a hiss threshold comparison) have been described separately, it is possible to combine both aspects in the ANC decision control. For instance, the decision on whether to deactivate the ANC circuitry as taken in block 33 of FIG. 7 may be verified by making a determination as to whether the estimated ambient noise is louder than the hiss threshold as per FIG. 8.

In accordance with another embodiment of the invention, the decision to deactivate ANC may be made in part or entirely based on having detected that a mobile phone handset is not being held firmly against the user's ear. For example, in a conventional iPhone™ device, there is a proximity detector circuit or mechanism that can indicate when the device is being held against a user's ear (and when it is not). Such a proximity sensor or detector may use infrared transmission and detection incorporated in the mobile phone handset, to provide the indication that the handset is close to an object such as the user's ear. The ANC decision control circuitry in such an embodiment would be coupled to the proximity detector, as well as the ANC circuitry, and would deactivate the latter when the proximity detector indicates that the handset is not being held sufficiently close to the user's ear. The decision to deactivate ANC in this case may be based entirely on the output of the proximity detector, or it may be based on considering both the output of the proximity detector and one or more of the audio signal processing-based techniques described above in connection with, for instance, FIG. 7 or FIG. 8.

As explained above, an embodiment of the invention may be a machine-readable medium (such as microelectronic memory) having stored thereon instructions, which program one or more data processing components (generically referred to here as a "processor") to perform the digital audio processing operations described above including noise and signal strength measurement, filtering, mixing, adding, inversion, comparisons, and decision making. In other embodiments, some of these operations might be performed by specific hardware components that contain hardwired logic (e.g., dedicated digital filter blocks). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For instance, the error microphone 8 may instead be located within the housing of a wired or wireless headset, which is connected to a smart phone handset. The description is thus to be regarded as illustrative instead of limiting.

What is claimed is:

1. A portable audio device comprising:

an earpiece speaker having an input to receive an audio signal;

active noise cancellation (ANC) circuitry to provide an anti-noise signal at the input of the earpiece speaker to control ambient acoustic noise outside of the device that is heard by a user of the device;

a first microphone to pick up the ambient acoustic noise, wherein the ANC circuitry includes an adaptive filter that generates the anti-noise signal using a representation of the ambient acoustic noise as picked up by the first microphone;

noise measurement circuitry having a first input coupled to an output of a second microphone, a second input coupled to receive the audio signal and the anti-noise signal, a first filter that models the earpiece speaker and the second microphone, a differencing unit having a first input coupled to the output of the second microphone and a second input coupled to an output of the first filter, and a second filter that models the earpiece speaker and the second microphone, wherein the audio signal is to pass through the first and second filters and the anti-noise signal is to pass through the first filter and further wherein the second microphone is positioned closer to the earpiece speaker than the first microphone and is to pick up (a) sound emitted from the earpiece speaker and (b) the ambient acoustic noise; and control circuitry coupled to receive an estimate of the ambient acoustic noise from the noise measurement circuitry and to deactivate the ANC circuitry in response to determining that an estimate of how much sound emitted from the earpiece speaker has been corrupted by said ambient acoustic noise, indicates insufficient corruption by noise.

2. The portable audio device of claim 1 wherein the ANC circuitry comprises an anti-noise filter that inverts a signal at its input, the input being coupled to receive the estimate of the ambient acoustic noise.

3. The portable audio device of claim 1 wherein the control circuitry is to calculate signal to noise ratio (SNR) as referring to the audio signal and said ambient acoustic noise, and wherein the control circuitry is to deactivate the ANC circuitry when the calculated SNR is above a predetermined threshold.

4. The portable audio device of claim 1 wherein the control circuitry comprises:

a smoothing conditioner to smooth the signals from outputs of the second filter and the differencing unit; and a decision circuit having first and second inputs coupled to receive the smoothed signals, respectively, and an output that indicates whether or not the ANC circuitry is to be deactivated.

5. The portable audio device of claim 4 wherein the control circuitry is to calculate signal to noise ratio (SNR) using the smoothed signals, and wherein the control circuitry is to deactivate the ANC circuitry when the calculated SNR is above a predetermined threshold.

6. The portable audio device of claim 1 wherein the ANC circuitry when activated can enhance intelligibility of a far-end user's speech contained in the audio signal and as heard by a near-end user of the device through the earpiece speaker, during a call between the far-end user and the near-end user.

7. A method for performing a call using a portable audio communications device comprising:

activating active noise cancellation (ANC) circuitry so that an anti-noise signal is output to control ambient acoustic noise during the call at an earpiece speaker of the portable audio communications device;

passing a downlink speech signal of the call and the anti-noise signal through a first filter that models the earpiece speaker and an error microphone;

computing an estimate of the ambient acoustic noise using the first filtered downlink speech signal and the first filtered anti-noise signal;

passing the downlink speech signal of the call through a second filter that models the earpiece speaker and the error microphone;

determining, using the computed ambient noise estimate and the second filtered downlink speech signal, that sound emitted from an earpiece speaker of the device is not being sufficiently corrupted by said ambient acoustic noise; and deactivating the ANC circuitry in response to the determination.

8. The method of claim 7 wherein the determining comprises comparing signal to noise ratio (SNR), referring to the downlink speech signal and the ambient acoustic noise, to a predetermined threshold to find that the SNR is greater than the predetermined threshold.

9. The method of claim 7 wherein the deactivating the ANC circuitry comprises:

setting a plurality of tap coefficients of a digital anti-noise filter whose output feeds the earpiece speaker, to zero.

10. The method of claim 9 wherein the deactivating the ANC circuitry further comprises:

disabling an adaptive filter controller that updates the tap coefficients, so that the tap coefficients are no longer being updated.

11. The method of claim 7 wherein the deactivating the ANC circuitry comprises:

disabling an adaptive filter controller that updates a plurality of tap coefficients of a digital anti-noise filter, so that the tap coefficients are no longer being updated.

12. A method for performing a call using a portable audio communications device, comprising:

a) determining that an estimate of how much sound emitted from an earpiece speaker of the device during the call has been corrupted by ambient acoustic noise, indicates sufficient corruption by noise;

b) in response to the determination in a), activating active noise cancellation (ANC) circuitry so that an anti-noise signal is output to control the ambient acoustic noise during the call at an earpiece speaker of the portable audio communications device;

b2) passing a downlink speech signal of the call and the anti-noise signal through a first filter that models the earpiece speaker and an error microphone;

b3) computing an estimate of the ambient acoustic noise using the first filtered downlink speech signal and the first filtered anti-noise signal;

b4) passing the downlink speech signal of the call through a second filter that models the earpiece speaker and the error microphone;

c) determining , using the computed ambient noise estimate and the second filtered downlink speech signal, that sound emitted from the earpiece speaker during the call has not been corrupted by ambient acoustic noise; and d) deactivating the ANC circuitry in response to the determination in c).

* * * * *